US012665552B2

(12) United States Patent
Ishihara et al.

(10) Patent No.: US 12,665,552 B2
(45) Date of Patent: Jun. 23, 2026

(54) PROTECTION CIRCUIT FOR POWER AMPLIFIERS

(71) Applicant: pSemi Corporation, San Diego, CA (US)

(72) Inventors: Shota Ishihara, San Diego, CA (US); Tero Ranta, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 582 days.

(21) Appl. No.: 18/056,128

(22) Filed: Nov. 16, 2022

(65) Prior Publication Data

US 2024/0162864 A1    May 16, 2024

(51) Int. Cl.
H03F 1/52 (2006.01)
H03F 1/22 (2006.01)

(52) U.S. Cl.
CPC ............ H03F 1/523 (2013.01); H03F 1/223 (2013.01); H03F 2200/171 (2013.01); H03F 2200/441 (2013.01); H03F 2200/451 (2013.01)

(58) Field of Classification Search
CPC .... H03F 1/523; H03F 1/223; H03F 2200/171; H03F 2200/441; H03F 2200/451;
(Continued)

(56) References Cited

U.S. PATENT DOCUMENTS 6,166,530 A    12/2000  D'Angelo
6,525,611 B1    2/2003  Dening et al.
(Continued)

FOREIGN PATENT DOCUMENTS

CN    101174788 A    5/2008
CN    107071640 A    8/2017
(Continued)

OTHER PUBLICATIONS

International Search Report and Written Opinion for International Application No. PCT/US2023/079343 filed on Nov. 10, 2023 on behalf of PSEMI Corporation Mail Date: Apr. 8, 2024 10 pages.
(Continued)

*Primary Examiner* — Andrea Lindgren Baltzell
*Assistant Examiner* — Khiem D Nguyen
(74) *Attorney, Agent, or Firm* — Steinfl + Bruno LLP

(57)    ABSTRACT

Various methods and circuital arrangements for protection of a power amplifier (PA) from high input power conditions are presented. According to one aspect, a protection circuit coupled to a stage of the PA limits a current through the stage during the high input power conditions. Limiting of the current is provided by a current limiter circuit that includes a current generator coupled to a current mirror. The current is limited to a high value that is based on a reference current generated by the current generator. In one aspect, the reference current is programmable or variable. In another aspect the protection circuit includes a clamp that limits a low voltage at an output of the current limiter circuit. In another aspect, the protection circuit includes a pre-charge circuit that pre-charges the output of the current limiter circuit. In another aspect a filter is embedded within the current limiter circuit.

29 Claims, 18 Drawing Sheets

(58) Field of Classification Search

CPC .... H03F 2200/54; H03F 1/0261; H03F 3/195; H03F 3/68; H03F 1/0211

USPC .......................... 330/296, 298, 297, 127, 129

See application file for complete search history.

(56) References Cited

U.S. PATENT DOCUMENTS

| | | | |
|---|---|---|---|
| 7,605,651 B2 * | 10/2009 | Ripley ................. | H03F 1/0233 |
| | | | 330/285 |
| 8,368,355 B2 | 2/2013 | Tam | |
| 8,487,705 B2 | 7/2013 | Yao et al. | |
| 9,413,298 B2 | 8/2016 | Nobbe et al. | |
| 9,876,478 B2 | 1/2018 | Modi et al. | |
| 10,153,737 B2 | 12/2018 | Ishihara et al. | |
| 10,965,255 B1 | 3/2021 | Ishihara | |
| 12,034,410 B2 | 7/2024 | Ishihara | |
| 2002/0183021 A1 | 12/2002 | Brandt | |
| 2006/0197594 A1 | 9/2006 | Scuderi et al. | |
| 2009/0206933 A1 | 8/2009 | Prikhodko et al. | |
| 2010/0329304 A1 | 12/2010 | Doorenbos | |
| 2011/0221533 A1 | 9/2011 | Lesso | |
| 2011/0254511 A1 | 10/2011 | Tam | |
| 2011/0279185 A1 | 11/2011 | Lautzenhiser | |
| 2011/0292554 A1 | 12/2011 | Yao et al. | |
| 2012/0313709 A1 | 12/2012 | Lautzenhiser | |
| 2015/0333711 A1 | 11/2015 | Langer | |
| 2016/0072452 A1 | 3/2016 | Ripley et al. | |
| 2016/0241200 A1 | 8/2016 | Nadimpalli et al. | |
| 2017/0026008 A1 * | 1/2017 | Hong ................... | H03F 1/0261 |
| 2019/0267948 A1 | 8/2019 | Su et al. | |
| 2019/0296722 A1 | 9/2019 | Lu et al. | |
| 2019/0348959 A1 | 11/2019 | Lasser et al. | |
| 2021/0075376 A1 | 3/2021 | Birkbeck | |
| 2021/0234523 A1 | 7/2021 | Morisawa et al. | |
| 2022/0182016 A1 * | 6/2022 | Ranta ...................... | H03F 3/193 |
| 2022/0239261 A1 | 7/2022 | Ishihara | |
| 2024/0072731 A1 | 2/2024 | Ishihara | |
| 2024/0322762 A1 | 9/2024 | Ishihara | |

FOREIGN PATENT DOCUMENTS

| | | |
|---|---|---|
| KR | 20110129836 A | 12/2011 |
| WO | 98/21820 A1 | 5/1998 |
| WO | 03/030328 A1 | 4/2003 |
| WO | 2021/086755 A1 | 5/2021 |
| WO | 2024/044049 A1 | 2/2024 |

OTHER PUBLICATIONS

International Search Report and Written Opinion issued for International Application No. PCT/US2023/029994 filed on Aug. 10, 2023 on behalf of PSEMI Corporation. Mail Date: Nov. 16, 2023. 16 pages.

Notice of Allowance issued for U.S. Appl. No. 17/719,291, filed Apr. 12, 2022 on behalf of pSemi Corporation. Mail Date: Mar. 20, 2024. 10 Pages.

Van Bezooijen, A., et al., "Over-Temperature Protection By Adaptive Output Power Control," The 9th European Conference on Wireless Technology, IEEE, Piscatawey, NJ, US, Sep. 10, 2006. pp. 350-352. XP031005314.

Corrected Notice of Allowability for U.S. Appl. No. 16/669,384, filed Oct. 30, 2019 on behalf of pSemi Corporation. Mail Date: Mar. 1, 2021. 4 pages.

International Search Report and Written Opinion for International PCT Application No. PCT/US2020/057171 filed on Oct. 23, 2020, on behalf of pSemi Corporation. Mail Date: Feb. 10, 2021. 9 Pages.

Notice of Allowance for U.S. Appl. No. 16/669,384, filed Oct. 30, 2019 on behalf of pSemi Corporation. Mail Date: Nov. 25, 2020. 9 pages.

Chinese Office Action for CN Application No. 202080075821.5 filed on Apr. 28, 2022 on behalf of PSEMI Corporation Mail Date: Aug. 13, 2025 14 pages (English + Original).

Korean Notice of Preliminary Rejection for KR Application No. 10-2022-7017964 filed on Apr. 16, 2025 on behalf of PSEMI Corporation Mail Date: Apr. 16, 2025 12 pages (English + Original).

Non-Final Office Action for U.S. Appl. No. 18/056,128, filed Nov. 16, 2022 on behalf of PSEMI Corporation Mail Date: Jun. 4, 2025 16 pages.

Non-Final Office Action for U.S. Appl. No. 17/821,731, filed Aug. 23, 2022 on behalf of PSEMI Corporation. Mail Date: Jun. 17, 2025. 20 pages.

Zhang F. et al., "Advanced active gate drive for switching performance improvement and overvoltage protection of high-power IGBTs " *IEEE Transactions on Power Electronics*, vol. 33 No. 5, May 31, 2018, pp. 3802-3815.

* cited by examiner

100a

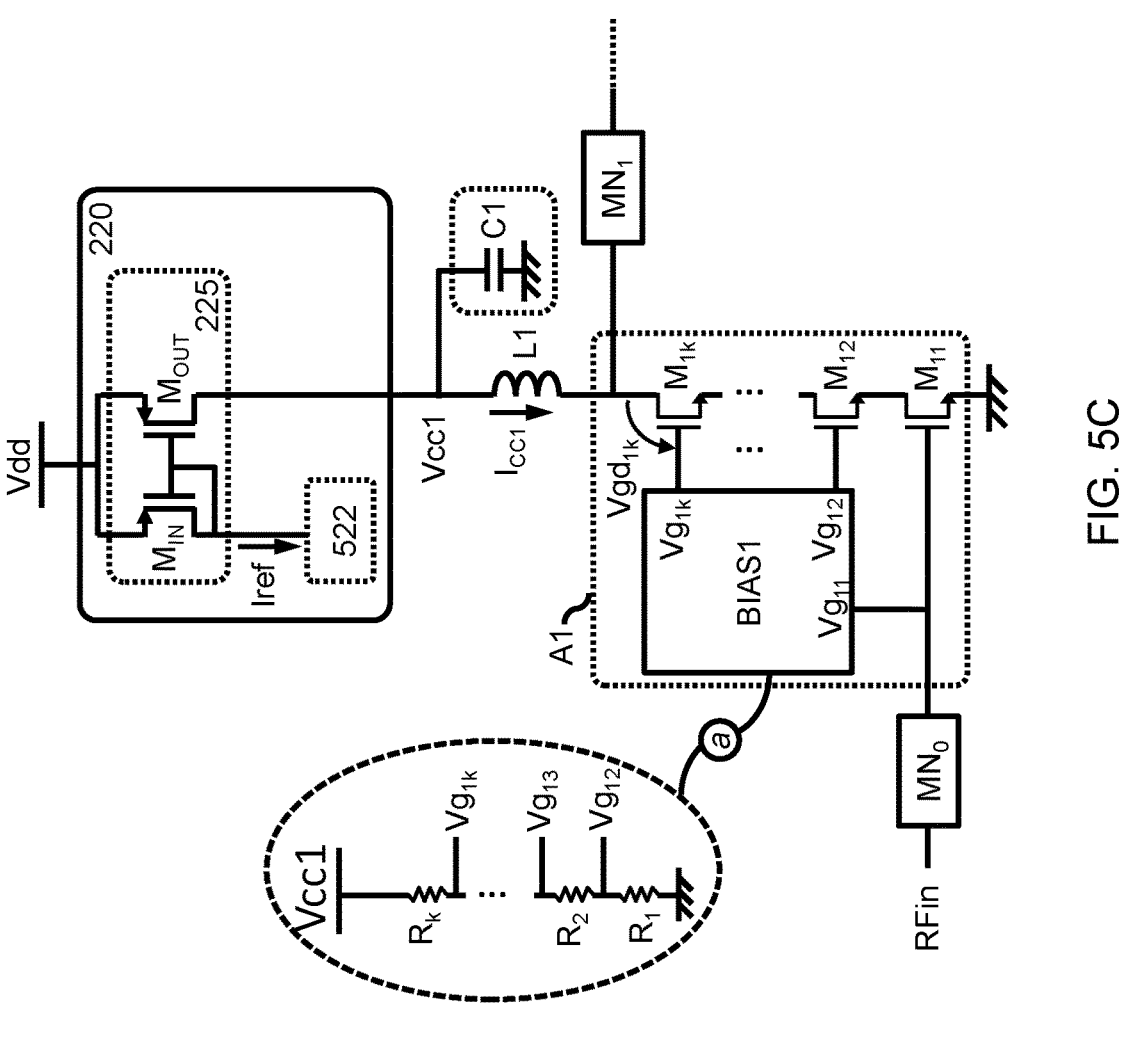
FIG. 5C
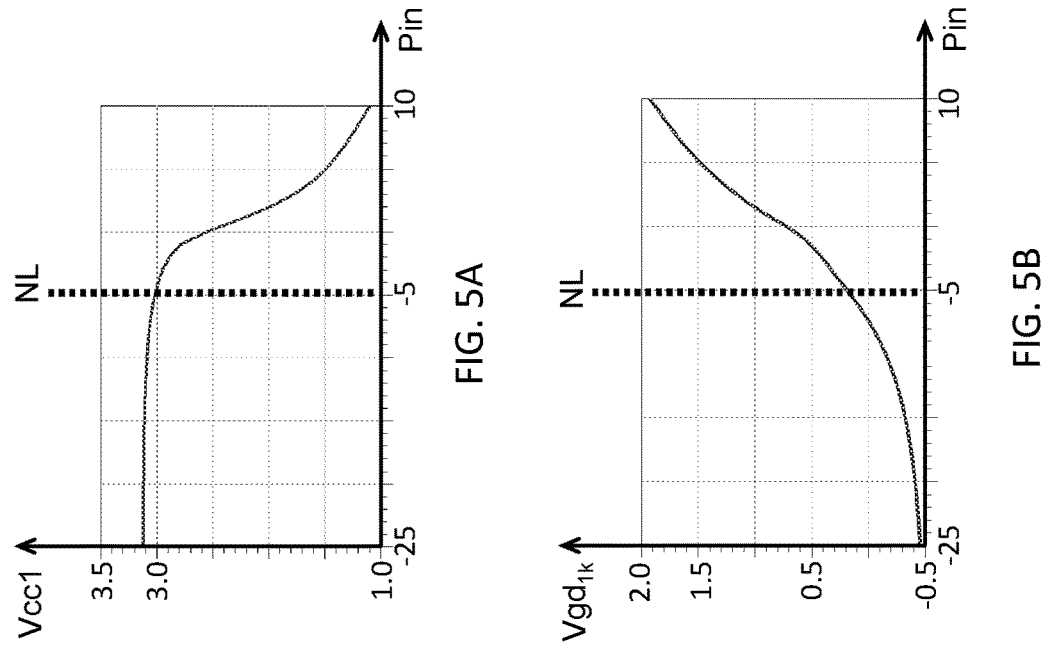
FIG. 5A
FIG. 5B

1200 coupling an output leg of a current limiter circuit to a supply voltage node of a first stage of the multi-stage amplifier

1310 based on the coupling, limiting a high value of a current that flows from the supply voltage node through the first stage based on a reference current that flows through an input leg of the current limiter

1320

1300

PROTECTION CIRCUIT FOR POWER AMPLIFIERS

TECHNICAL FIELD

The present application relates to amplifiers. In particular, the present application relates to protection of power amplifiers (PAs).

BACKGROUND

FIG. 1A shows a prior art radio frequency (RF) power amplifier (PA) module (100a) which can be used, for example, in a transmitter section of an RF front-end communication system, such as for example, a mobile communication system. As shown in FIG. 1A, the power amplifier module (100a) can include a number of cascaded amplifier stages (e.g., driver stage A1, final stage A2), coupled in series connection via matching networks (e.g., $MN_0$, $MN_1$, $MN_2$), for amplification of an input RF signal, RFin, to generate therefrom an amplified output RF signal, RFout. Power to the amplifier stages (A1, A2) may be provided via corresponding supply voltages (Vcc1, Vcc2, which may be same or separate) referenced to a reference ground, the supply voltages coupled to the amplifier stages (A1, A2) through respective inductors (L1, L2). The amplified signal, RFout, can in turn be transmitted via, for example, an antenna that is coupled to the PA module (100a) through an antenna switch (e.g., as known in the art).

As shown in FIG. 1B, each of the amplifier stages (A1, A2) may include a respective cascode arrangement of stacked (FET) transistors, ($M_{11}$, $M_{12}$, ... $M_{1k}$) and ($M_{21}$, $M_{22}$, ... $M_{2k}$), each such cascode arrangement coupled between the respective supply voltage (Vcc1, Vcc2) and the reference ground. Furthermore, as shown in FIG. 1B, biasing of each of the transistors, ($M_{11}$, $M_{12}$, ... $M_{1k}$) and ($M_{21}$, $M_{22}$, ... $M_{2k}$), may be provided via an associated biasing circuit, BIAS1 and BIAS2, that is configured to generate gate voltages to gates of each of the stacked transistors. In particular, a (gain setting) DC biasing current (e.g., $I_{CC1}$, $I_{CC2}$) that flows through each of the transistor stacks, ($M_{11}$, $M_{12}$, ... $M_{1k}$) and ($M_{21}$, $M_{22}$, ... $M_{2k}$), may be predominantly based, during normal operating conditions of the PA module (100a), on a gate voltage provided to a respective input transistor (e.g., $M_{11}$, $M_{12}$). In other words, a gain of each of the amplifier stages (A1, A2), i.e., a ratio between RF power at a corresponding (drain of an) output transistor (e.g., $M_{1k}$, $M_{2k}$) and RF power at a corresponding (gate of an) input transistor (e.g., $M_{11}$, $M_{21}$), may be based on the respective DC biasing current (e.g., $I_{CC1}$, $I_{CC2}$).

Normal operating conditions of the PA module (100a) may include a high limit of the input RF power provided by the input RF signal, RFin, which in turn may define a high limit of the output RF power of the amplifier stage A1 that is provided as input to the amplifier stage A2. However, under certain conditions, whether controlled (e.g., during ruggedness test) or not (e.g., transients), the input RF power to the amplifier stage A1 may go above the high limit and/or include a DC component (e.g., an average DC component in the RF signal) that may couple to the gate of the input transistor, $M_{11}$, to provide a higher gain (i.e., higher magnitude $I_{CC1}$) of the amplifier stage A1. In combination, such effects may produce an input RF signal to the amplifier stage A2 that may include an amplitude that is sufficiently high to damage, or at least affect performance (e.g., hot carrier injection), of the corresponding input transistor, $M_{21}$. In other words, an amplitude of the RF signal to the amplifier stage A2 may cause any one of the gate-to-source voltage, Vgs, the gate-to-drain voltage, Vgd, or the drain-to-source voltage, Vds, of the input transistor, $M_{21}$, to reach sufficiently high levels to damage and/or affect performance of the transistor.

It follows that there may be a need for improved protection of an RF amplifier module against high input RF power conditions that may not be considered as normal operating conditions. Teachings according to the present disclosure provide such improved protection while maintaining an ongoing activity of the RF amplifier module.

SUMMARY

According to a first aspect of the present disclosure, a circuit is presented, comprising: a plurality of cascaded amplifier stages; and a protection circuit coupled to a supply voltage node of a first stage of the plurality of cascaded amplifier stages, the first stage operating between the supply voltage node and a reference ground, wherein the protection circuit comprises: a current limiter circuit configured to limit a high value of a supply current that flows from the supply voltage node to the reference ground through the first stage, the high value of the supply current based on a magnitude of a reference current.

According to a second aspect of the present disclosure, a method for protecting a multi stage amplifier from high input power condition is presented, the method comprising: coupling an output leg of a current limiter circuit to a supply voltage node of a first stage of the multi stage amplifier; and based on the coupling, limiting a high value of a current that flows from the supply voltage node through the first stage based on a reference current that flows through an input leg of the current limiter.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 5A and FIG. 5B show graphs representative of possible performance disadvantages that may be provided by the current limiter circuit according to the present disclosure.

FIG. 5C shows a simplified schematic of a biasing circuit according to an example embodiment of the present disclosure that may be used to overcome the possible performance disadvantages represented in FIG. 5A and FIG. 5B.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 2A:
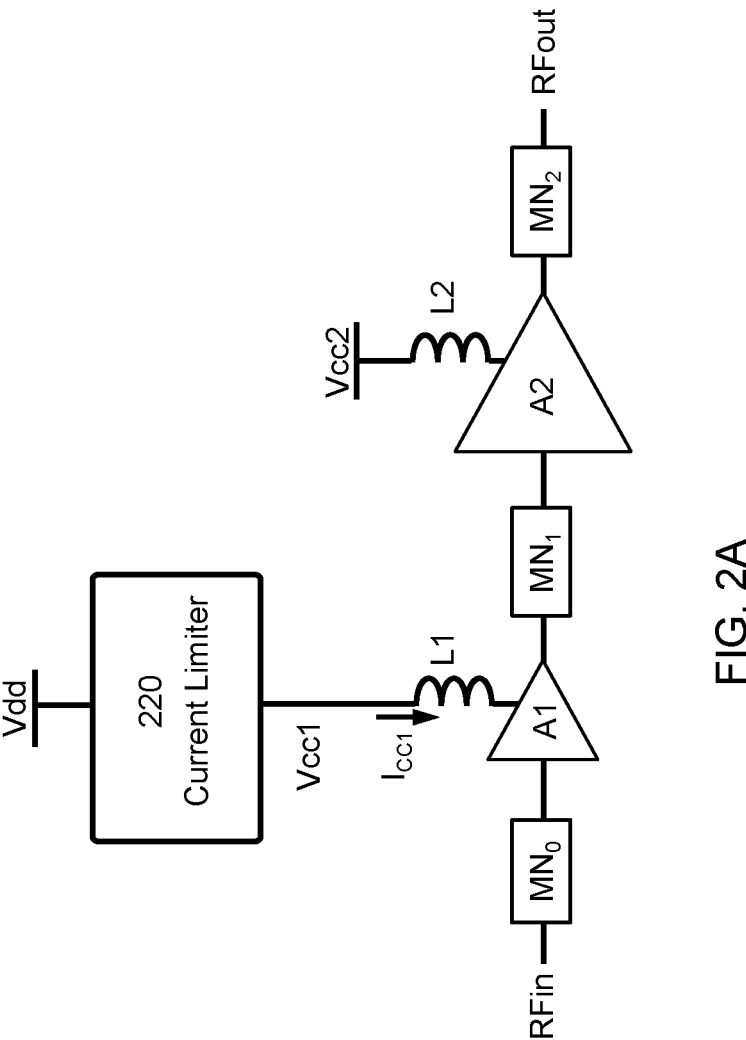
FIG. 2A shows a configuration according to an embodiment of the present disclosure of a RF power amplifier (PA) module with a protection circuit.

FIG. 2A shows a configuration according to an embodiment of the present disclosure comprising an RF power amplifier (PA) module (200a) that includes a protection circuit (220) that is coupled to a first (e.g., driver) stage A1 of the PA module (200a). According to an embodiment in accordance with the present disclosure, the protection circuit (220) may include a current limiter (circuit) that is configured to limit a magnitude of a current supplied to the first stage A1. In other words, the current limiter of the protection circuit (220) may limit a high value of the DC biasing/supply current $I_{CC1}$, and therefore limit a gain of the first stage, A1. By limiting the gain of the first stage A1, an input power to the second (e.g., final) stage A2 may be limited to values that may not damage or otherwise negatively affect performance of the second stage, A2, including of the input transistor (e.g., $M_{21}$) of the second stage, A2.

The protection circuit (220) according to the present teachings may be designed to limit the current supplied to a stage (e.g., A1) only for values of an input RF power to the stage (e.g., RFin) that are beyond/greater than values expected under normal operating conditions of the PA module (200a). According to an embodiment in accordance with the present disclosure, limiting of the current supplied to the stage (e.g., A1) may not halt operation of such stage, and therefore may allow maintaining of an ongoing activity of the PA module (200a).

Figure 1A:
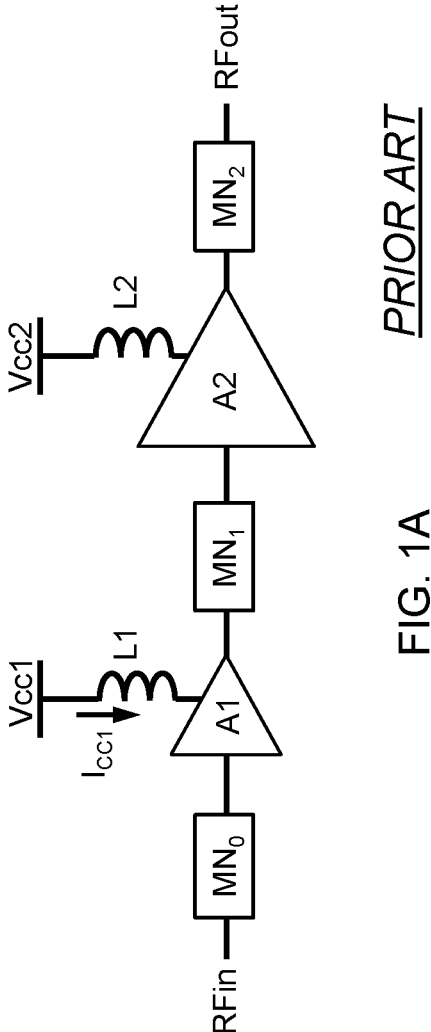
FIG. 1A shows a prior art RF power amplifier (PA) module including a plurality of cascaded amplifier stages.
Figure 2C:
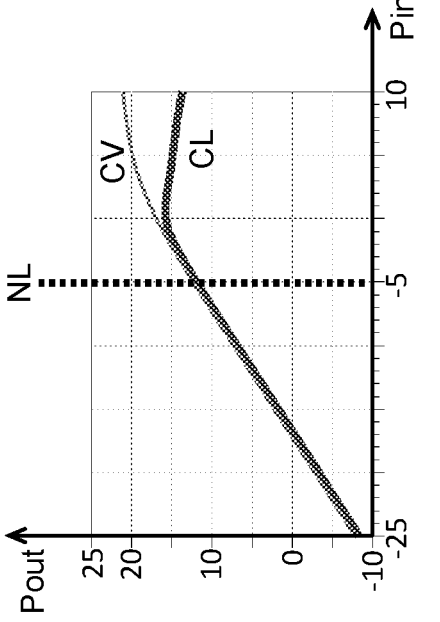
FIG. 2B and FIG. 2C show graphs representative of performance advantages provided by the protection circuit of FIG. 2A.
Figure 2B:
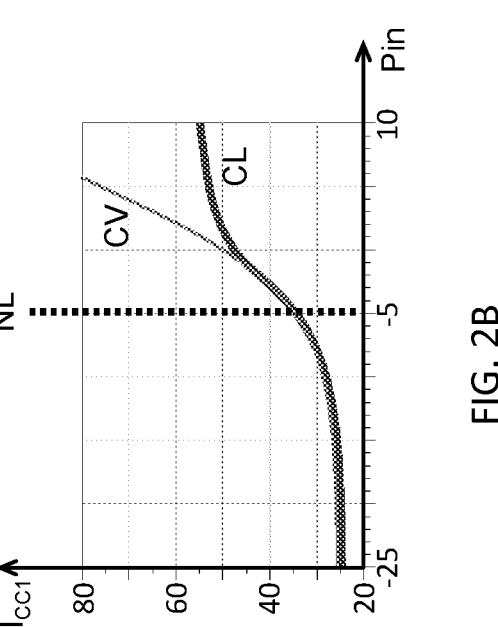

FIG. 2B and FIG. 2C show graphs representative of performance advantages provided to the PA module (200a) by the protection circuit of FIG. 2A when compared to the (unprotected) prior art PA module (e.g., 100a of FIG. 1A). In such graphs, normal operating conditions of the PA modules (200a, 100a) are represented by an input power, Pin, to the first stage (e.g., A1 of FIGS. 1A, 2A) in a range of values to the left of (i.e., smaller than) a power limit line, NL (shown at an example input power limit value of −5 dBm). As shown in FIG. 2B, during normal operating conditions, the supply current (e.g., $I_{CC1}$, labeled as CL in the graph) to the first stage, A1, of the (protected) PA module (e.g., 200a of FIG. 2A) is substantially same as the supply current (e.g., $I_{CC1}$ labeled as CV in the graph) to the first stage, A1, of the (unprotected) prior art PA module (e.g., 100a of FIG. 1A). However, for values of the input power, Pin, that are greater than the input power limit (e.g., right of the power limit line NL), the supply current (e.g., $I_{CC1}$, labeled as CL in the graph) to the (protected) PA module (e.g., 200a of FIG. 2A) gradually flattens when a current limit is reached (e.g., where the two graphs separate), whereas the supply current (e.g., $I_{CC1}$, labeled as CV in the graph) to the prior art (unprotected) PA module (e.g., 100a of FIG. 1A) constantly increases (with no upper current limit). Accordingly, as shown in the graphs of FIG. 2C, the output power, Pout, of the first stage A1, for the protected (CL) and unprotected (CV) configurations may follow same trend as the supply currents. In particular, as shown in FIG. 2C, and as a consequence of the current limiting, for values of the input power, Pin, to the first stage (e.g., A1 of FIGS. 1A, 2A) that are greater than the input power limit (e.g., right of the power limit line NL), the output power, Pout, (labeled as CL in the graph) of the first stage A1 of the (protected) PA module (e.g., 200a of FIG. 2A) stops increasing (e.g., gradually decreases when the current limit is reached), whereas the output power, Pout, (labeled as CV in the graph) of the first stage A1 of the prior art (unprotected) PA module (e.g., 100a of FIG. 1A) constantly increases (with no upper power limit). More details on such graphs can be found later in the present disclosure (e.g., with reference to FIG. 3A).

Figure 3A:
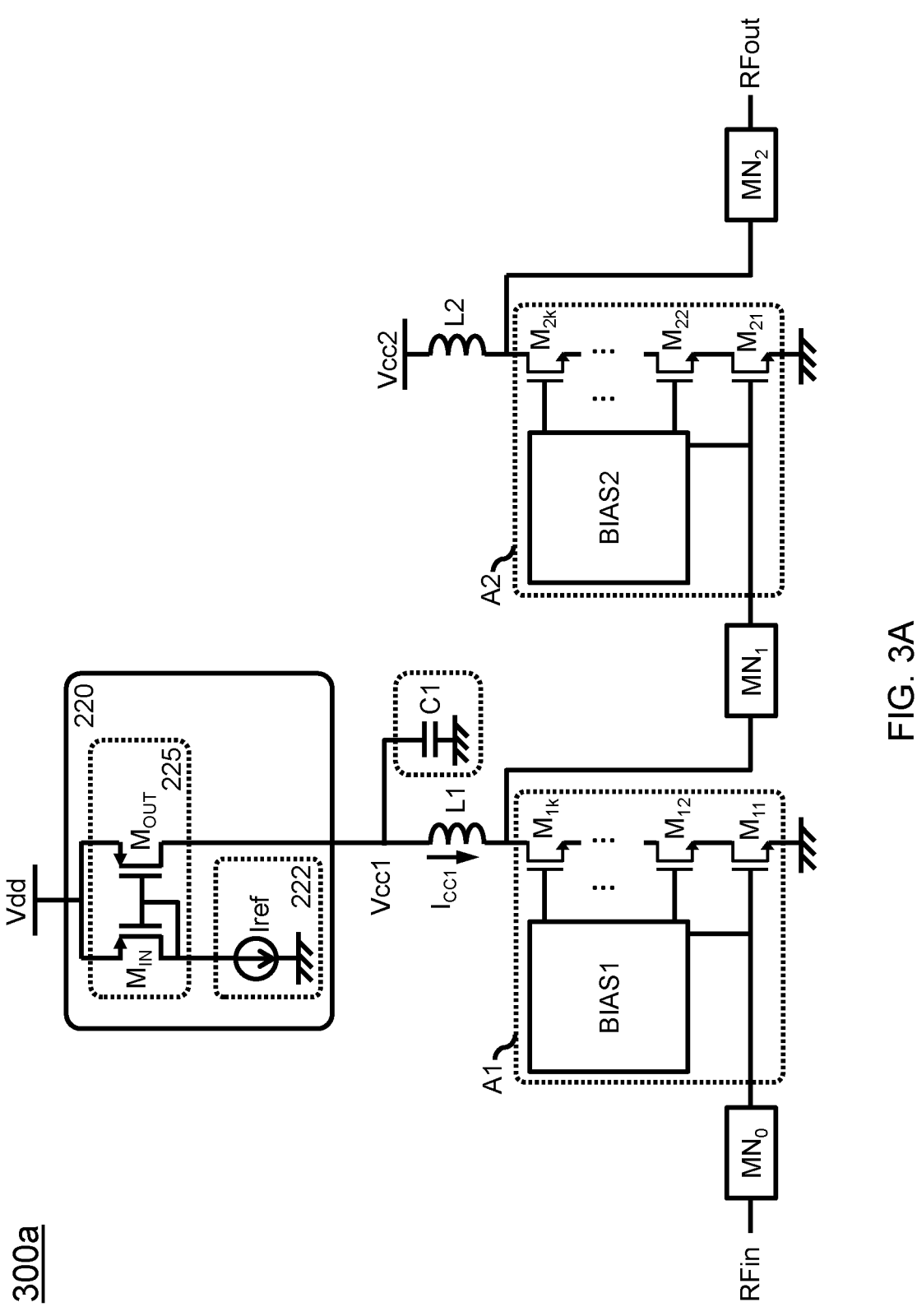
FIG. 3A shows a simplified schematic of a current limiter circuit according to an embodiment of the present disclosure that may be used in the protection circuit of FIG. 2A.

FIG. 3A shows a simplified schematic of a current limiter circuit (222, 225) according to an embodiment in accordance with the present disclosure that may be included in the protection circuit (220) described above with reference to FIG. 2A. In the particular case shown in FIG. 3A, stages (A1, A2) of a PA module (300a) are shown to include respective cascode arrangement of stacked (FET) transistors, ($M_{11}$, $M_{12}$, . . . $M_{1k}$) and ($M_{21}$, $M_{22}$, . . . $M_{2k}$), as described above with reference to FIG. 1B. According to an embodiment in accordance with the present disclosure, the current limiter (222, 225) may include a reference current source (222) coupled to a current mirror (225). The reference current source (222) may generate a reference current, Iref, that may be used by an input leg (e.g., PMOS FET transistor $M_{IN}$) of the current mirror (225), to generate therefrom a current conducted through the output leg (e.g., PMOS FET transistor $M_{OUT}$) that may be used as the biasing/supply current, $I_{CC1}$, to the first stage, A1. As shown in FIG. 3A, the transistors ($M_{IN}$, $M_{OUT}$) of the current mirror (225) may be coupled to one another through their respective gates, and coupled to a supply voltage, Vdd, through their respective sources. Drain of the input transistor, $M_{IN}$, of the current mirror (225) may be coupled to the reference current source (222), and drain of the output transistor, $M_{OUT}$, of the current mirror (225) may be coupled to the first stage, A1, through the inductor, L1. In particular, as shown in FIG. 3A, the drain of the output transistor, $M_{OUT}$, of the current mirror (225) may be coupled to the drain of the output (NMOS FET) transistor, $M_{1k}$, of the cascode arrangement of stacked (FET) transistors, ($M_{11}$, $M_{12}$, . . . $M_{1k}$). A bypass capacitor, C1, may be coupled at an output of the protection circuit (220), or in other words, at the supply voltage node, $V_{CC1}$, so to reduce coupling of RF frequency components to the protection circuit (220). In other words, the bypass capacitor, C1, in combination with the inductor, L1, may form a filter that is configured to reduce such coupling of the RF frequency components to the protection circuit (220).

With continued reference to FIG. 3A, in some embodiments, the current limiter (222, 225) may limit a high value (magnitude) of the supply current, $I_{CC1}$, based on a mirrored value of the reference current, Iref. In some embodiments, such mirrored value may be ratiometrically related to the reference current, Iref, based on, for example, ratio of respective sizes of the transistors ($M_{IN}$, $M_{OUT}$) of the current mirror (225). For a nonlimiting example case where the ratio of the sizes of the transistors ($M_{IN}$, $M_{OUT}$) is one (same size transistors), then the mirrored value of the reference current, Iref, that determines the high value of the supply current, $I_{CC1}$, may be equal to the value of the reference current, Iref.

When the current limiter (222, 225) is coupled to the first stage, A1, as shown in FIG. 3A, the supply current, $I_{CC1}$, output by the current limiter (222, 225) may follow a demand current based on a biasing of the input transistor, $M_{11}$, of the first stage, A1, up to a limit that is determined by the mirrored value of the reference current, Iref. During a current limiting condition, or in other words when the demand current is greater than the mirrored value of the reference current, Iref, a voltage at the supply voltage (node), $V_{CC1}$, may decrease in order to limit the current through the first stage, A1, which in turn may increase, to some extent, the current conducted through the output leg (e.g., transistor $M_{OUT}$ sees a different bias condition) of the current limiter (222, 225) beyond the mirrored value as shown in the graph (CL) of FIG. 2B. At the same time, such decrease of the voltage at the supply voltage, $V_{CC1}$, during the current limiting condition, may decrease, to some extent, the power output by the first stage as shown in the graph (CL) of FIG. 2C.

Figure 4B:
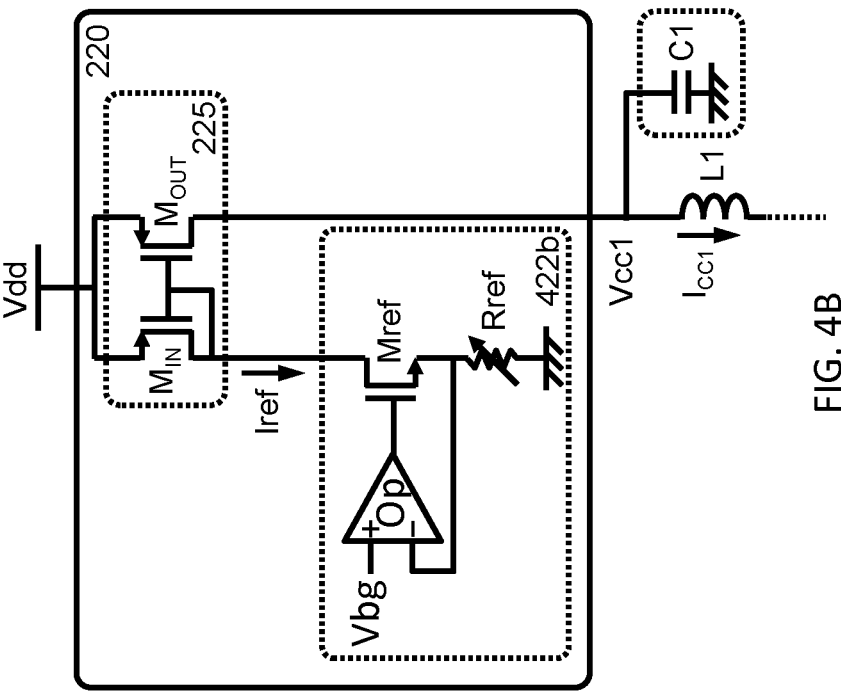
FIG. 4A, FIG. 4B and FIG. 4C show simplified schematics of other current limiter circuits according to further embodiments of the present disclosure that may be used in the protection circuit of FIG. 2A.
Figure 4A:
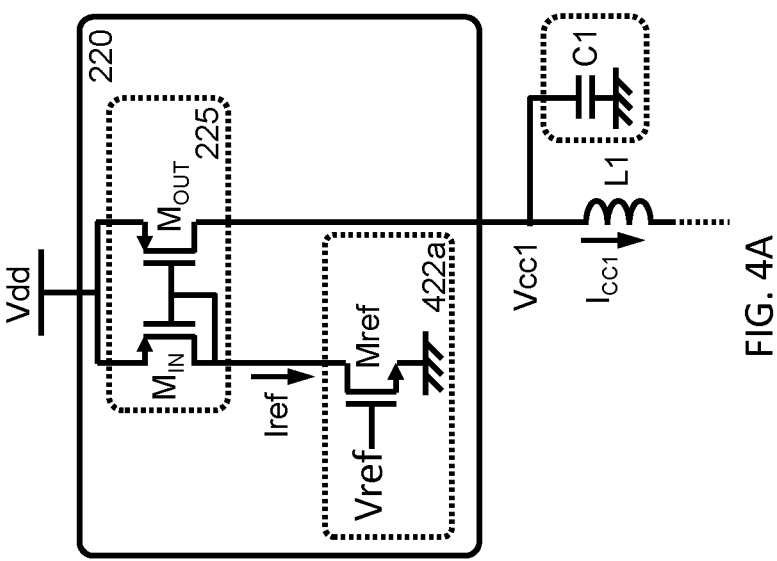
Figure 4C:
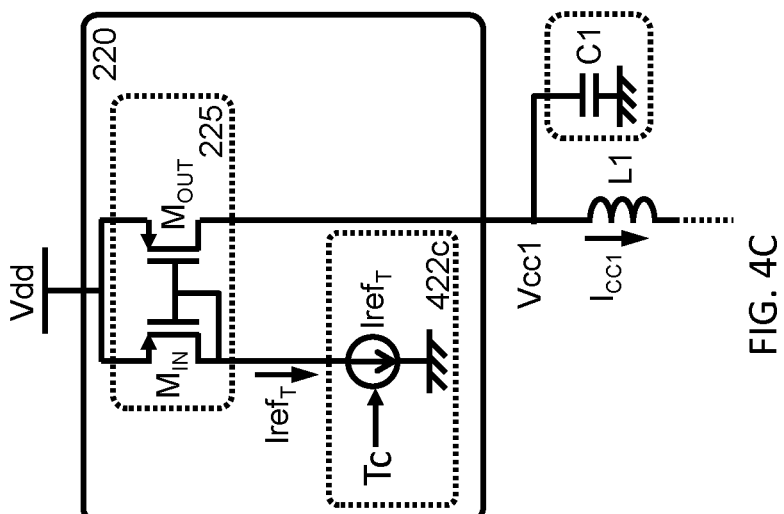
Figure 8A:
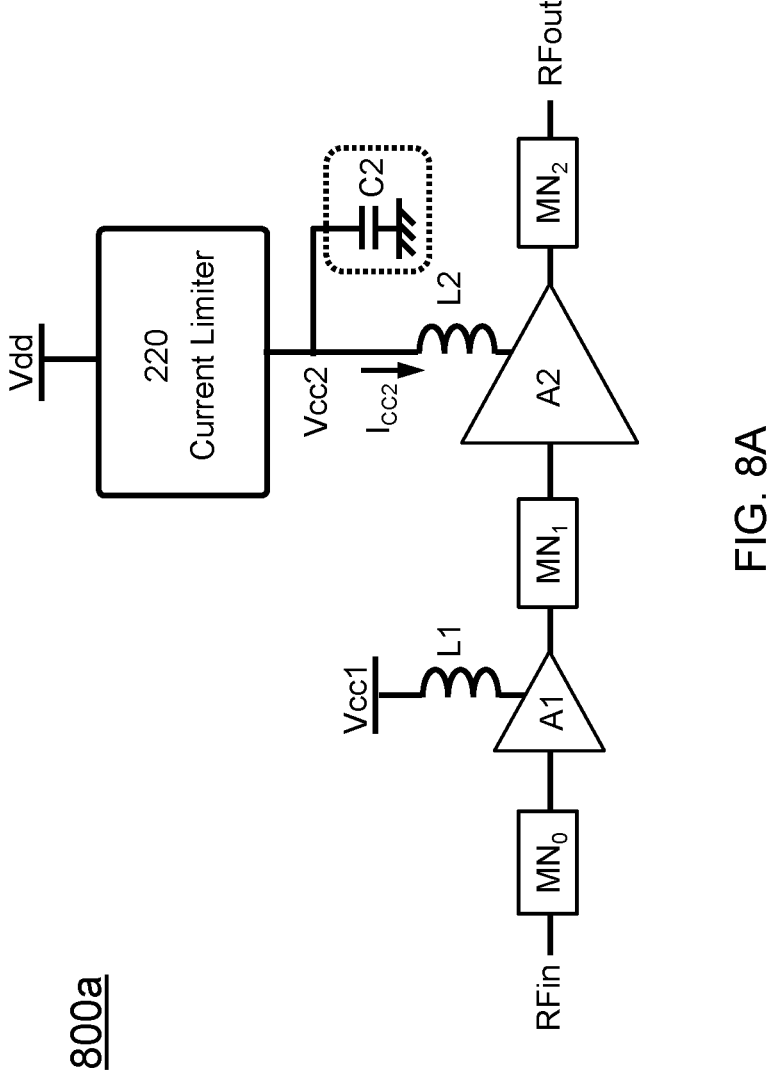
FIG. 8A shows a configuration according to another embodiment of the present disclosure of a RF power amplifier (PA) module with a protection circuit that is coupled to a final stage.
Figure 9:
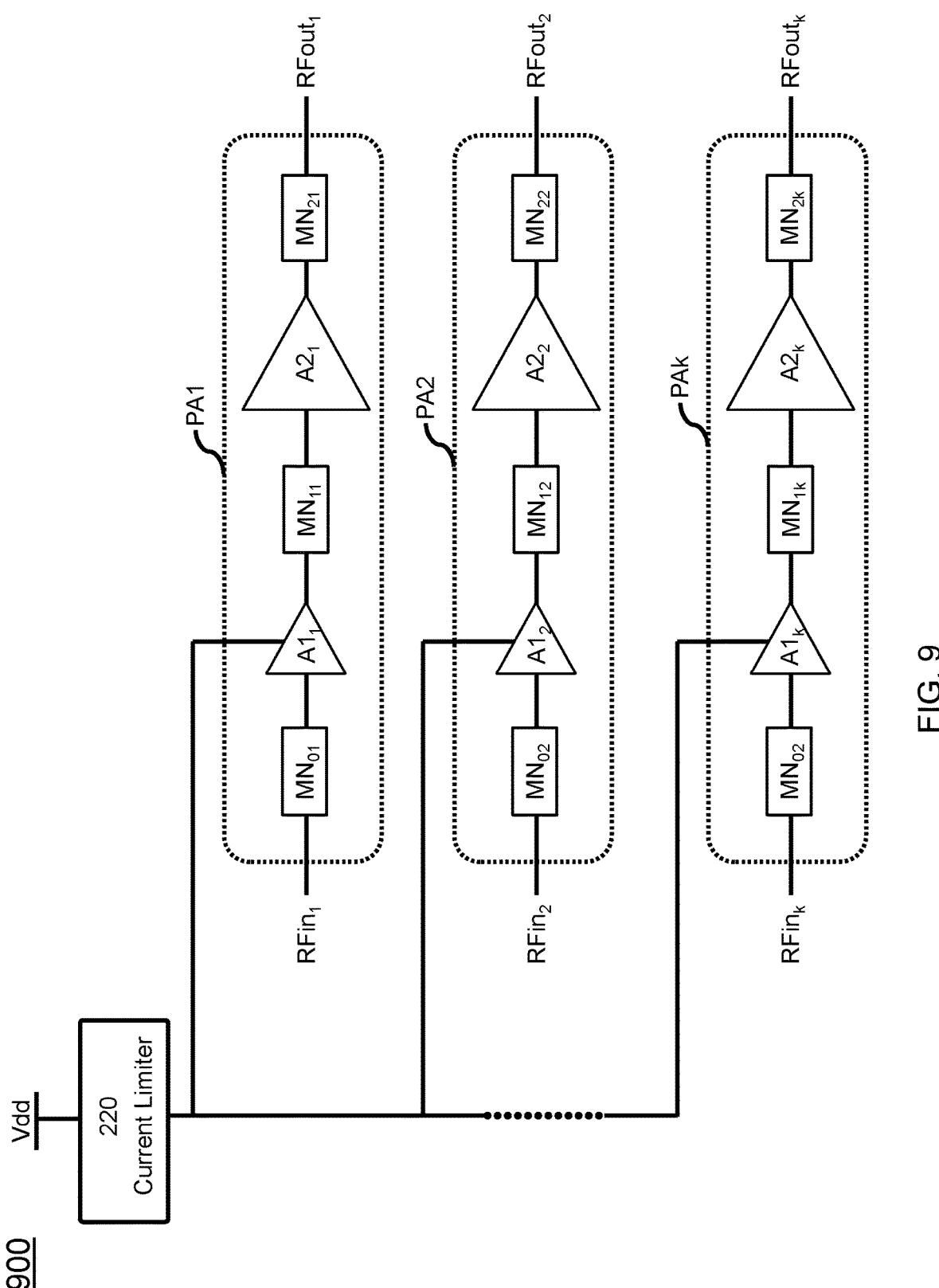
FIG. 9 shows a configuration according to yet another embodiment of the present disclosure of a protection circuit that is shared amongst a plurality of RF power amplifier (PA) modules.
Figure 11:
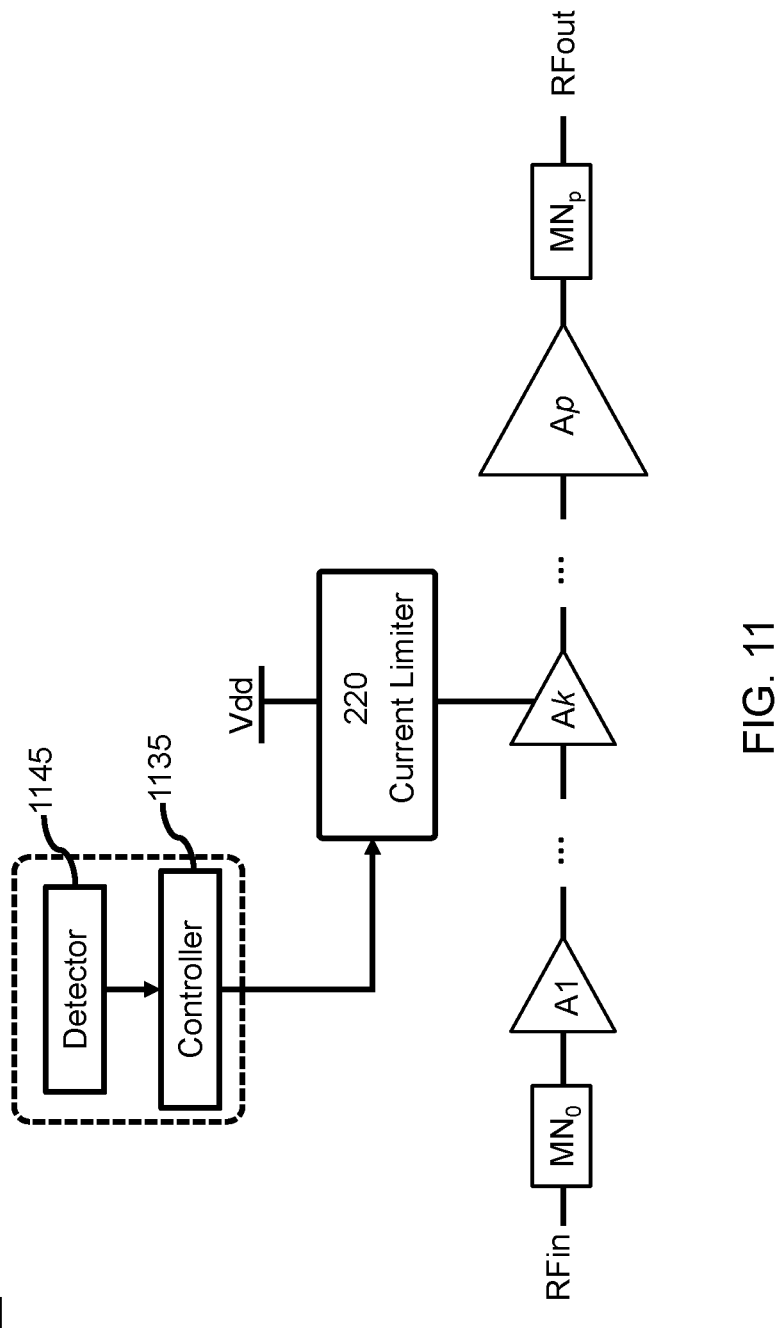
FIG. 11 shows a configuration according to an embodiment of the present disclosure of a RF power amplifier (PA) module with a protection circuit whose operation may be controlled based on detected parameter values.
Figure 12:
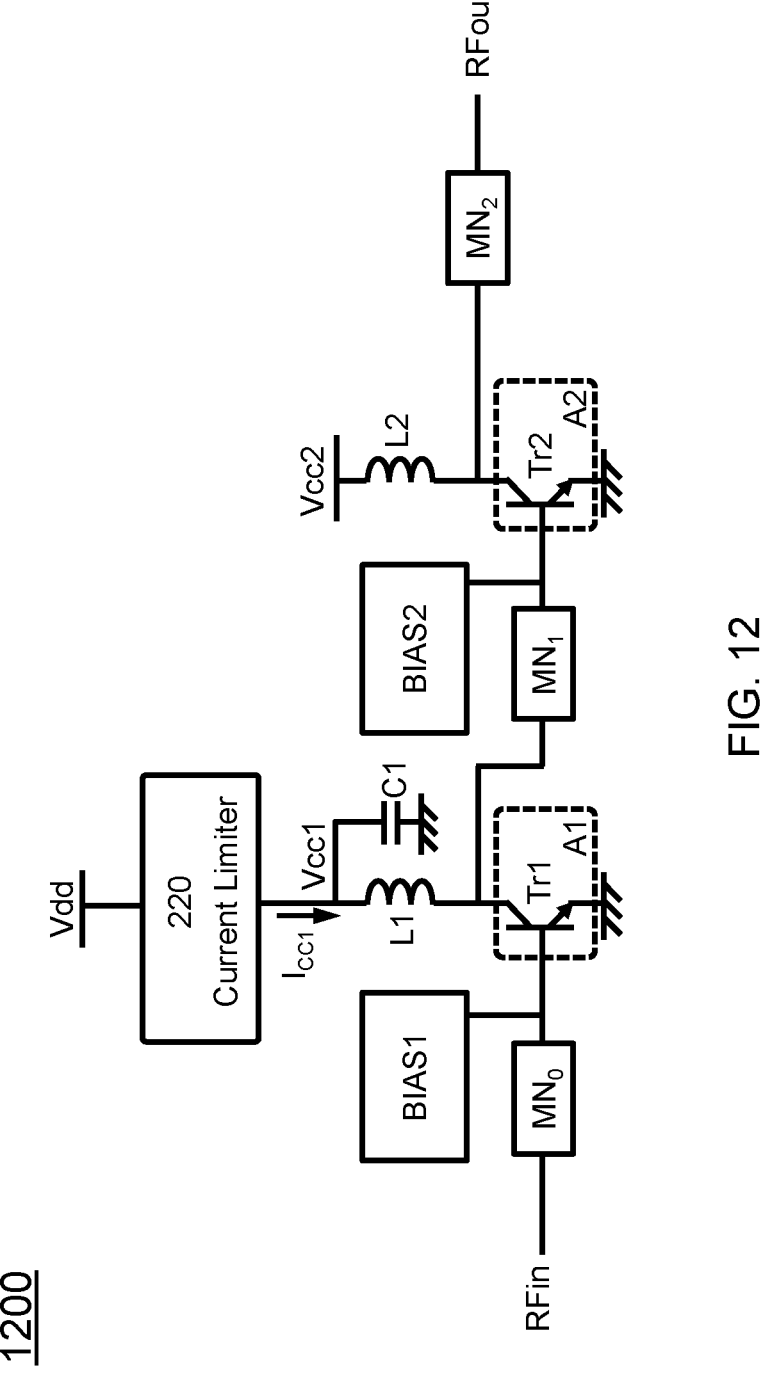
FIG. 12 shows a configuration according to an embodiment of the present disclosure of a RF power amplifier (PA) module with a protection circuit, the RF PA module including a bipolar transistor.

With continued reference to FIG. 3A, in some embodiments flexibility and advantages provided by the current limiter (222, 225), include, for example: protection, via limiting of current to at least one stage of a PA module (e.g., 300a of FIG. 3A) for high input power conditions, without halting operation of the (protected) PA module; no delay in protection for the high input power conditions since no detection schemes (e.g., current or power sensor) are used, rather the limiting of the current is a (natural) response of a supply current circuit to the at least one stage; absence of any oscillation risk that may be contributed by various feedback methods (e.g., RF power detection and feedback to limit a supply current); tunability and/or selectivity of a (high) value of the (limiting) current (e.g., current limit) via a tunable/selectable Iref current source/generator (e.g., 222 of FIG. 3A, and 422a/b of FIGS. 4A/4B later described), and therefore of a corresponding input power limit value (e.g., threshold) defining the high input power conditions; capability to include temperature compensation/profile for the limiting current (and therefore power) as later described with reference to FIG. 4C; capability to protect any one or more of a plurality of stages of the PA module, including of the final stage, as later described with reference to FIGS. 8A/8B/8C; capability to share a same protection circuit (e.g., current limiter) with a plurality of PA modules as later described with reference to FIG. 9; capability to further control a high value of the limiting current (e.g., value of the current limit) based on other detectable parameters such as, for example, temperature or voltage/power levels, as later described with reference to FIG. 11; and capability for use with either a MOS PA module that includes MOS devices (e.g., FIG. 3A) or a bipolar PA module that may include bipolar devices, such as GaAs (Gallium Arsenide) devices (e.g., FIG. 12 later described).

Figure 3C:
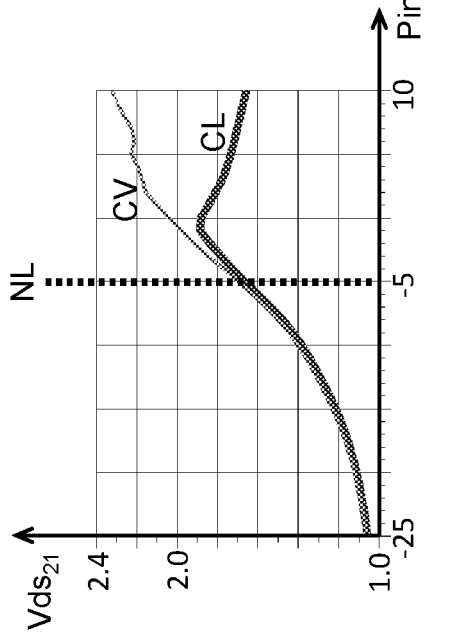
FIG. 3B and FIG. 3C show graphs representative of performance advantages provided by the current limiter circuit of FIG. 3A.
Figure 3B:
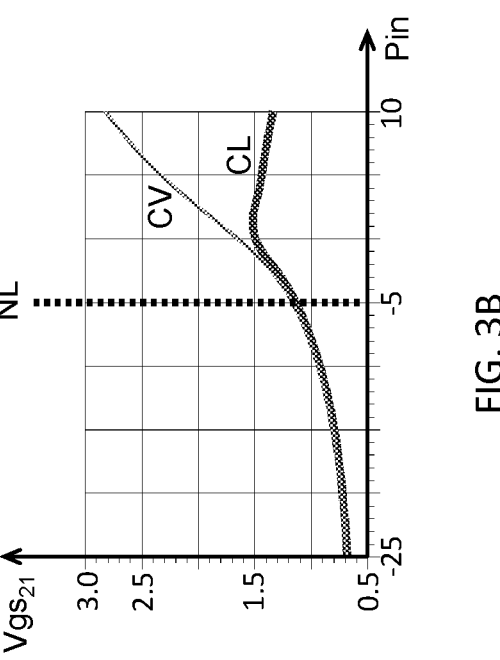

FIG. 3B and FIG. 3C show graphs representative of performance advantages provided by the current limiter circuit (222, 225) of FIG. 3A in protecting elements/transistors of the stage A2. In other words, by limiting a supply current (e.g., $I_{CC1}$ of FIG. 3A) to a first stage (e.g., A1 of FIG. 3A), elements/transistors of a next/second stage (e.g., A2 of FIG. 3A) can be protected against high input RF power conditions to which a multi-stage PA module (e.g., 300a of FIG. 3A) comprising the first stage and next stage may be subjected. Advantageously, by not coupling a protection circuit (e.g., 220 of FIG. 3A) to a higher power final stage (e.g., A2 of FIG. 3A) of the multi-stage PA module, overall RF performance of such module may be maintained since a flow of a high supply current to the final stage through the protection circuit may be avoided.

Figure 1B:
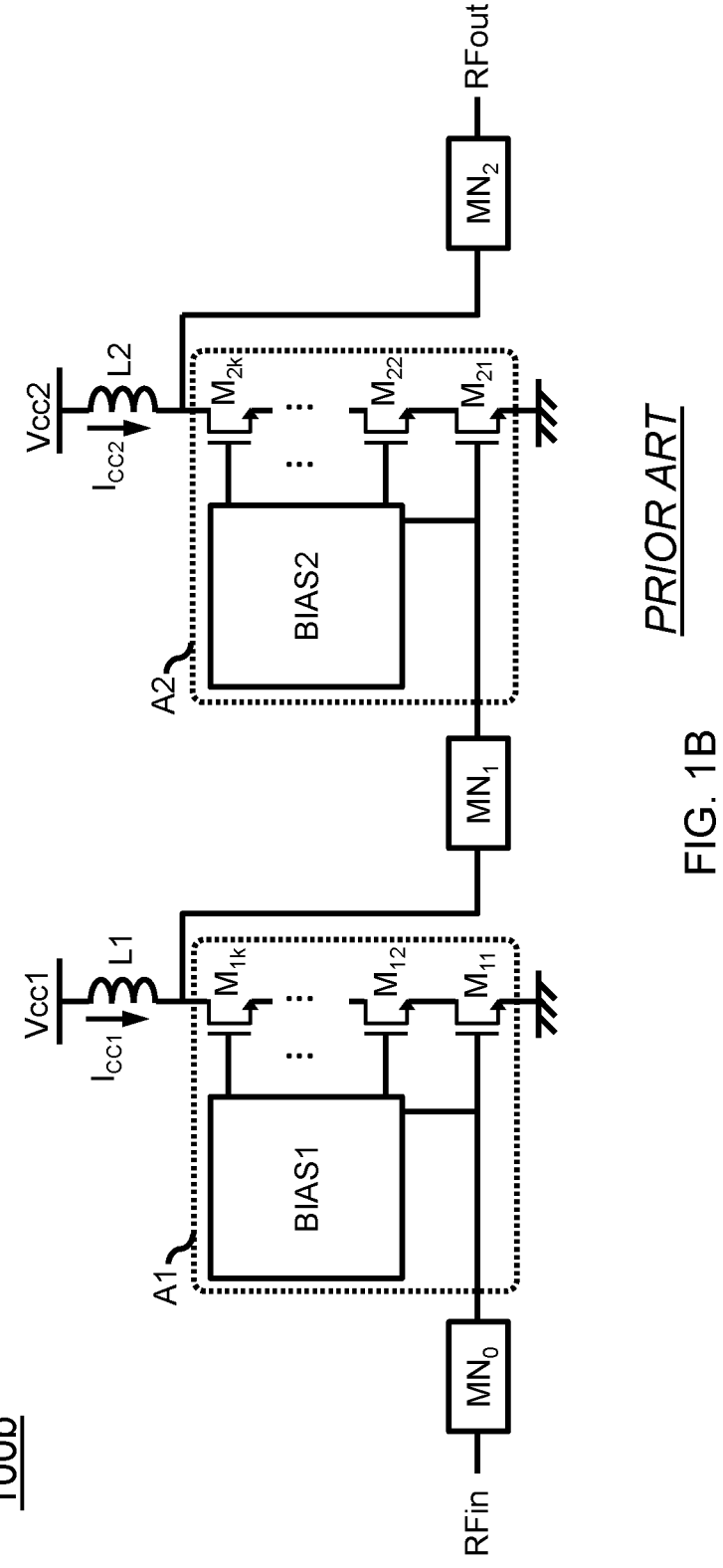
FIG. 1B shows an example implementation of the cascaded amplifier stages of the PA module.

As shown in the graphs of FIG. 3B and FIG. 3C, labeled as CV, (AC peak values of) the gate-to-source voltage, $Vgs_{21}$, and of the drain-to-source voltage, $Vds_{21}$, of the input transistor, $M_{21}$, of a second/final (unprotected) stage (e.g., A2 of FIG. 1B) may steadily increase for increasing values of the input power, Pin, to a first/driver (unprotected) stage (e.g., A1 of FIG. 1B). In particular, when operating under high input RF power conditions (right side of the line NL), the voltages, $Vgs_{21}$ and $Vds_{21}$, of the (unprotected) second/final stage may reach values (e.g., 2 volts and higher) that may be higher than a voltage withstand capability (e.g., about 2 volts) of the input transistor, $M_{21}$, thereby potentially damaging such transistor.

On the other hand, as shown in the graphs of FIG. 3B and FIG. 3C, labeled as CL, (AC peak values of) the gate-to-source voltage, $Vgs_{21}$, and of the drain-to-source voltage, $Vds_{21}$, of the input transistor, $M_{21}$, of a second/final (protected) stage (e.g., A2 of FIG. 3A) may gradually flatten when a first/driver (protected) stage (e.g., A1 of FIG. 3A) operates under high input RF power conditions (right side of the line NL), in particular, when the supply current to the first/drive stage reaches the current limit. Because of such flattening (i.e., current/power limiting), the voltages, $Vgs_{21}$ and $Vds_{21}$, of the (protected) second/final stage may not reach values that may be higher than the voltage withstand capability (e.g., about 2 volts) of the input transistor, $M_{21}$, thereby protecting such transistor.

FIG. 4A, FIG. 4B and FIG. 4C show simplified schematics of current limiter circuits according to further embodiments of the present disclosure that may be used in the protection circuit (220) of FIG. 2A. In particular, such figures show different example circuits (e.g., 422a, 422b, 422c) for generation of the reference current, Iref, that may be provided to the input leg (e.g., $M_{IN}$) of the current mirror (225). These include, for example, the voltage to current convertor circuit (422a) of FIG. 4A which generates a reference current, Iref, based on a reference voltage, Vref, provided to a gate of a common-source (e.g., NMOS FET) transistor, Mref. Accordingly, a value of the reference current, Iref, may be controlled/tuned/changed based on a value of the reference voltage, Vref, according to the I-V characteristics of the transistor Mref.

FIG. 4B shows another example voltage to current convertor circuit (422b) that may be used for generation of the reference current, Iref. In such implementation, a voltage, Vbg, input at a non-inverting input terminal (annotated by sign + in the FIGURE) of an operational amplifier, Op, and reproduced at the inverting input terminal (annotated by sign − in the FIGURE) of the operational amplifier, Op, is coupled to a source of a transistor, Mref. Because the source of the transistor, Mref, is coupled to the reference ground through a (shunted) resistor, Rref, then a voltage drop across the resistor, Rref, is equal to the voltage, Vbg, and therefore a current (i.e., Iref) through the transistor, Mref, is equal to the ratio of Vbg/Rref. According to an example embodiment of the present disclosure, the resistor, Rref, may optionally have a programmable, variable, or settable resistance than can be controlled/varied in steps and/or continuously. Such programmability of the resistor Rref can allow calibration of the voltage, Vbg, versus current, Iref, response provided by the circuit (422b).

Generation of the reference current, Iref, may include temperature compensation as shown in the circuit (422c) of FIG. 4C. In such implementation, the current, Iref, generated by the circuit (422c) may include a temperature profile designed to compensate for (e.g., take into account) a performance variation/sensitivity of the PA module to temperature variation, which may include for example, an increase, or a decrease, of a nominal biasing current (e.g., $I_{CC1}$) for a given performance metric (e.g., for a given output power). By providing such temperature profile, the reference current, Iref, and therefore, triggering of a current limiting condition, may be adapted to the sensitivity of (a stage of) the PA module at a given temperature. In some embodiments, design techniques for implementation of such temperature profile, may include, for example, use of one or more of a proportional to absolute temperature (PTAT) profile, a complementary proportional to absolute temperature (CTAT) profile, or a zero-proportionality to absolute temperature (ZTAT) profile.

FIG. 5A and FIG. 5B show graphs representative of possible performance disadvantages that may be provided by the current limiter circuit of the protection circuit (220) described above (e.g., FIGS. 2A-4C), and FIG. 5C shows a simplified schematic of a biasing circuit (shown encircled as detail α) according to an example embodiment of the present disclosure that may be used to overcome the possible performance disadvantages shown in FIG. 5A and FIG. 5B. In particular, FIG. 5C shows a portion of the configuration described above with reference to FIG. 3A that relates to the first stage, A1, and the protection circuit (220), wherein such protection circuit (220) includes a reference current source/generator (522) that may be any of the above-described current source/generators (222, 422a/b/c) with reference to FIG. 3A and FIGS. 4A/4B/4C.

As previously noted with reference to FIG. 3A, and as shown in the graph of FIG. 5A with further reference to FIG. 5C, when the demand current by the input transistor, $M_{11}$, of the first stage A1 is greater than the mirrored value of the reference current, Iref, or in other words, during a current limiting condition where the demand current is greater than the (limit) current the current limiter (522, 225) can generate/source, then a voltage at the supply voltage (node), $V_{CC1}$, may decrease in order to limit the current through the first stage, A1. Such decrease of the supply voltage, $V_{CC1}$, which can be seen to the right of the power limit line, NL, of FIG. 5A, can be up to several volts (DC). Considering the output (top) transistor, $M_{1k}$, of the first stage A1, a corresponding drain voltage, which is DC coupled to the supply voltage, $V_{CC1}$, may vary along with the supply voltage, $V_{CC1}$. Accordingly, if the gate voltage, $Vg_{1k}$, to the gate of the output transistor, $M_{1k}$, is fixed/constant, then as shown in FIG. 5B, a gate-to-drain voltage, $Vgd_{1k}$, of the output transistor, $M_{1k}$, may vary along with the supply voltage, $V_{CC1}$, and may reach a voltage level that may be sufficiently high to damage or otherwise affect performance of the output transistor, $M_{1k}$, and therefore of the first stage, A1, and of the PA module in general. On the other hand, by letting the gate voltage, $Vg_{1k}$, to the gate of the output transistor, $M_{1k}$, vary along with the supply voltage, $V_{CC1}$, as done by the biasing circuit shown in FIG. 5C as detail α, then the gate-to-drain voltage, $Vgd_{1k}$, of the output transistor, $M_{1k}$, may remain substantially fixed/constant in view of the varying of the supply voltage, $V_{CC1}$. The biasing circuit shown in FIG. 5C as detail α, may include a resistor ladder comprising series-connected resistors ($R_1$, $R_2$, . . . , $R_k$) coupled between the supply voltage node), $V_{CC1}$, and the reference ground to provide respective gate biasing voltages ($Vg_{12}$, . . . , $Vg_{1k}$) to the gates of the transistors ($M_{12}$, . . . , $Vg_{1k}$).

Figures 6A, 6B, 6C:
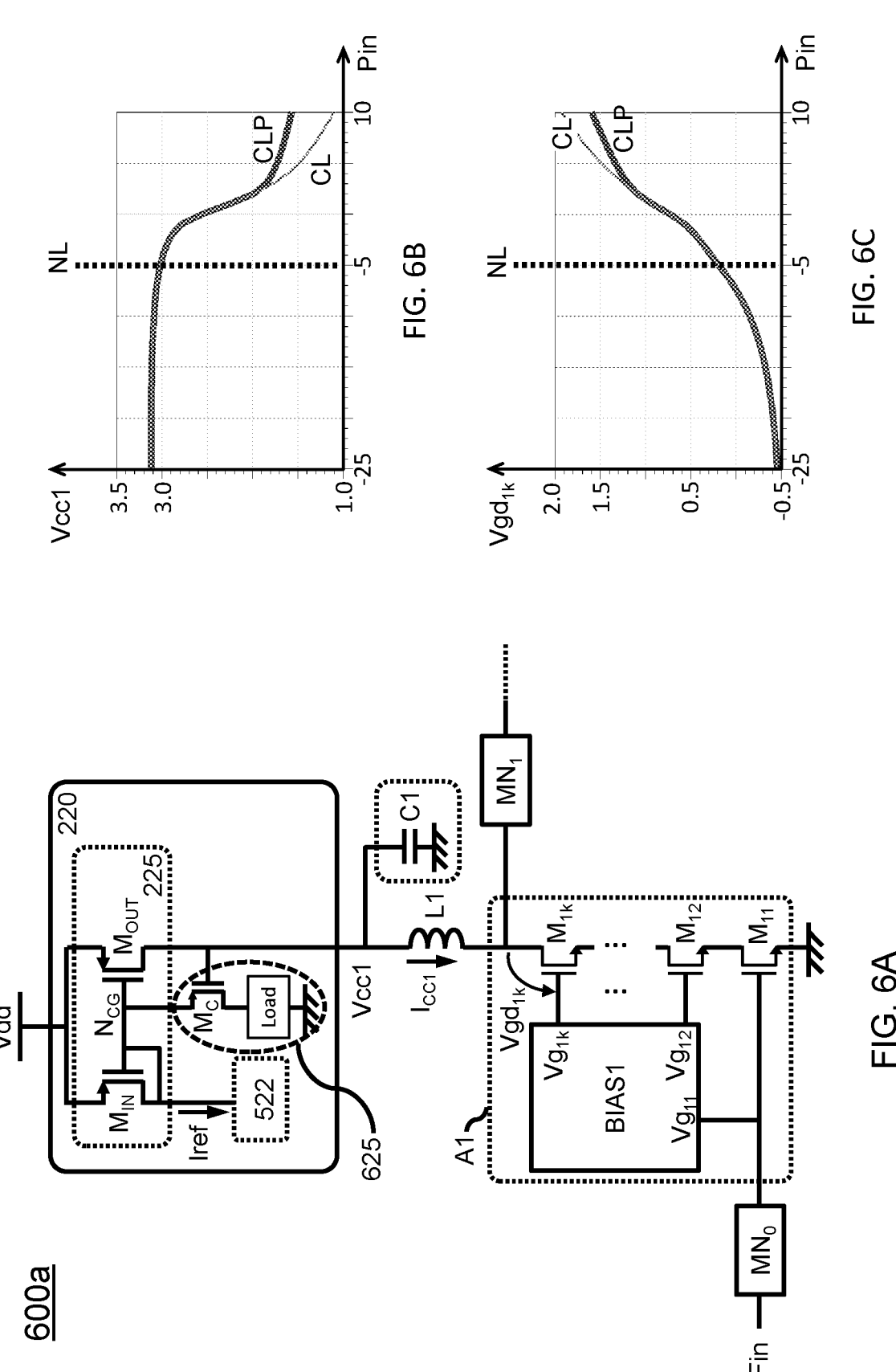
FIG. 6A shows a simplified schematic of a current limiter circuit with output voltage clamping according to an example embodiment of the present disclosure.
FIG. 6B and FIG. 6C show graphs representative of performance advantages provided by the current limiter circuit with output voltage clamping of FIG. 6A.

FIG. 6A shows a simplified schematic of a current limiter circuit (225, 522) with output voltage clamping according to an example embodiment of the present disclosure. As shown in FIG. 6A, according to an embodiment of the present disclosure, a clamping circuit (625) may be used to clamp/limit a low value of a voltage at an output of the current limiter circuit (225) that is coupled/connected to the supply voltage (node), $V_{CC1}$. Accordingly, an extent of a decrease of a voltage at the supply voltage (node), $V_{CC1}$, during a current limiting condition as described above with reference to FIGS. 5A/5C may be controlled/limited by the clamping circuit (625), and therefore, protection of the output (top) transistor, $M_{1k}$, of the first stage A1, against overvoltage (voltages higher than the withstand voltage) may be provided. In other words, the clamping circuit (625) of FIG. 6A may provide a solution to a transistor overvoltage problem associated with the decreasing voltage at the supply voltage (node), $V_{CC1}$, during the current limiting condition that is different from the solution provided by the biasing circuit shown in detail α of FIG. 5C. It should be noted that although both configurations of FIG. 5C and FIG. 6A may address a same problem, they may be used as separate solutions to the problem or together.

The clamping circuit (625) shown in FIG. 6A may include a (clamping, PMOS) transistor, $M_C$, comprising: a gate that is connected to the output of the current limiter circuit (225), and therefore to the drain of the transistor $M_{OUT}$, and to the node $V_{CC1}$; a source that is connected to a common (gate) node, $N_{CG}$, that connects the gates of the transistors ($M_{IN}$, $M_{OUT}$) of the current mirror (225); and a drain that is coupled to the reference ground through a load (Load). During normal operating conditions, the voltage at the node $V_{CC1}$ may be high enough to establish a gate-to-source voltage of the transistor, $M_C$, that is sufficiently low to maintain the transistor, $M_C$, in an OFF state (e.g., non-conducting state). On the other hand, during the current limiting condition, as the voltage at the node $V_{CC1}$ decreases, the gate-to-source voltage of the transistor, $M_C$, may increase until it reaches a level that is sufficiently high to turn ON (e.g., ON state, conducting state) the transistor, $M_C$. Turning ON of the transistor, $M_C$, may in turn lower a voltage at the common (gate) node, $N_{CG}$, to allow an increase in the current, $I_{CC1}$, output by the transistor, $M_{OUT}$, while maintaining the gate-to-source voltage of the transistor, $M_C$, at a substantially fixed/constant level (e.g., about 0.6 volts). Accordingly, a (low limit) voltage at the node $V_{CC1}$ may be established by the sum of the gate-to-source voltages of the transistors, $M_{CC1}$ and $M_{IN}$, or in other words, at about $Vdd-(2{*}0.6)$ volts (assuming a gate-to-source voltage of about 0.6 volts). Other low limit (clamping) voltage values may be obtained by designing the transistors, $M_{CC1}$ and $M_{IN}$, to provide corresponding ON state gate-to-source voltages (i.e., threshold voltages).

FIG. 6B and FIG. 6C show graphs representative of performance advantages provided by the current limiter circuit (225, 522) with output voltage clamping of FIG. 6A. In particular, in the current limiting condition (right side of line NL), when no output voltage clamping is provided, as shown in graph, CL of FIG. 6B, the voltage at the node, $V_{CC1}$, steadily/continuously decreases to reach levels that may be sufficiently low to cause, as shown in graph CL of FIG. 6C, an overvoltage condition (e.g., about 2 volts) of the gate-to-drain voltage, $Vgd_{1k}$, of the output transistor, $M_{1k}$. On the other hand, in the current limiting condition (right side of line NL), when output voltage clamping is provided, as shown in graph, CLP of FIG. 6B, the voltage at the node, $V_{CC1}$, decreases at a slower rate compared to the graph CL of FIG. 6B, such as to reach a low/clamped level that may be sufficiently high not to cause, as shown in graph CLP of FIG. 6C, an overvoltage condition (e.g., about 2 volts) of the gate-to-drain voltage, $Vgd_{1k}$, of the output transistor, $M_{1k}$.

Figure 7:
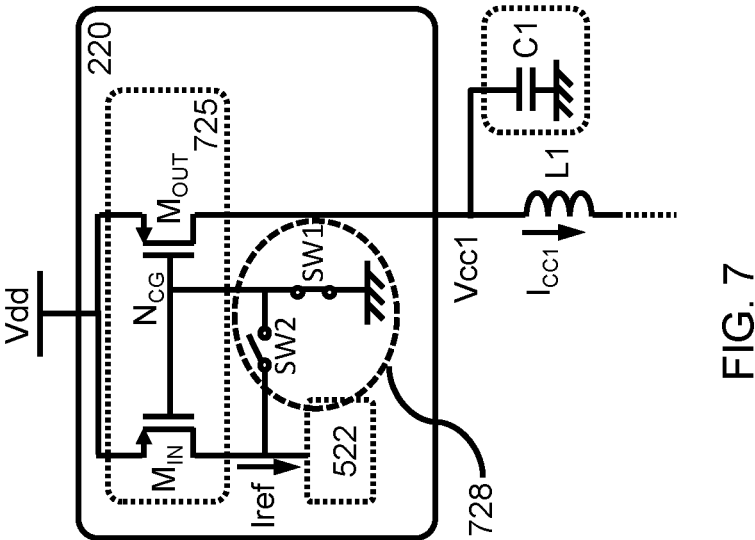
FIG. 7 shows a simplified schematic of a current limiter circuit with pre-charge of an output voltage according to an example embodiment of the present disclosure.

FIG. 7 shows a simplified schematic of a current limiter circuit (725, 522) with pre-charge of an output voltage according to an example embodiment of the present disclosure. As shown in FIG. 7, a (switching) pre-charge circuit (728) may be coupled to the current mirror (725) in order to pre-charge the bypass capacitor, C1, prior to operation/use (e.g., during a standby mode of operation) of the current limiter circuit (725, 522), thereby improving a turn on time of the current limiter circuit (725, 522) that may include a charging time of the bypass capacitor, C1, to a nominal operating voltage (at the node $V_{CC1}$).

According to an example embodiment of the present disclosure, as shown in FIG. 7, the pre-charge circuit (728) may include a first (e.g., single-pole, single throw, SPST) switch, SW1, having respective terminals coupled/connected to the common (gate) node, $N_{CG}$, and reference ground, and a second (e.g., single-pole, single throw, SPST) switch, SW2, having respective terminals coupled/connected to the common (gate) node, $N_{CG}$, and drain node of the transistor, $M_{IN}$, of the current mirror (725). During a pre-charge mode of operation (shown in FIG. 7, pre-charge circuit 728 activated), the first switch, SW1, may be closed and the second switch, SW2, may be open, therefore the gate of the transistor, $M_{OUT}$, of the current mirror (725) may be grounded and the transistor, $M_{OUT}$, may conduct a current to charge the bypass capacitor, C1, to the nominal operating voltage. At the same time, the second switch, SW2, may be open, so to remove possibility of a current leaked through the transistor, $M_{IN}$, to reach the common (gate) node, $N_{CG}$, and potentially impact the conducting state of the transistor, $M_{OUT}$. On the other hand, when the pre-charge circuit (728) is not activated (e.g., deactivated, inactive), the first switch, SW1, may be open and the second switch, SW2, may be closed, therefore reestablishing the configuration of the current limiter circuit (725, 522) according to the current limiter circuits described above, including, for example, reestablishing connection of the drain of the transistor, $M_{IN}$ to the common (gate) node, $N_{CG}$, and decoupling the common (gate) node, $N_{CG}$, from the reference ground.

Figures 8B, 8C:
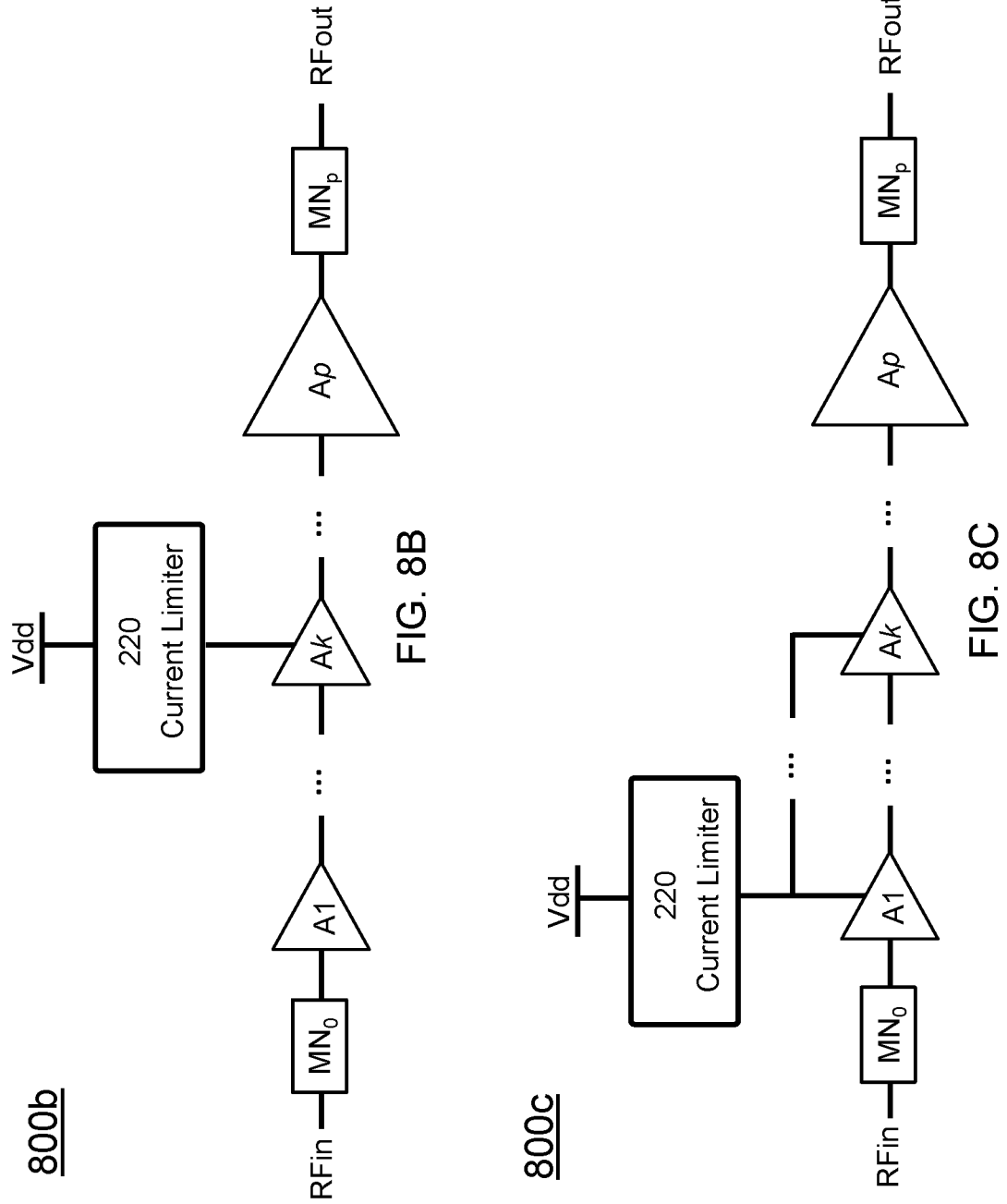
FIG. 8B shows a configuration according to yet another embodiment of the present disclosure of a RF power amplifier (PA) module with a protection circuit that is coupled to any one of a plurality of stages.
FIG. 8C shows a configuration according to yet another embodiment of the present disclosure of a RF power amplifier (PA) module with a protection circuit that is shared amongst a plurality of stages.

As shown in FIGS. 8A/8B/8C, the protection circuit (220) including any of the current limiter circuits described above with optional performance enhancements (e.g., FIG. 5C/6A/7), may be used/coupled to any one or more stages of a PA module to protect the PA module by limiting a current to a stage for protection of the same stage and/or protection of any next stage (not necessarily an immediate next/adjacent stage). This may include, for example, connection/coupling to: an output stage (e.g., A2) according to the configuration (800a) of FIG. 8A; a stage Ak of a plurality, p, of cascaded stages (A1, . . . , Ak, . . . , Ap) according to the configuration (800b) of FIG. 8B; or a plurality of stages (e.g., A1 and Ak) so that, as shown in the configuration (800c) of FIG. 8C, such stages (e.g., A1 and Ak) share a same protection circuit (220). It should be noted that such configurations may impose different requirements (e.g., current magnitudes, size of transistor $M_{OUT}$) on the current limiting circuit, that may be based, for example, on operating power conditions/levels of the stages to which the protection circuit may be coupled.

FIG. 9 shows a configuration (900) according to yet another embodiment of the present disclosure of a protection circuit (e.g., 220 that includes a current limiter) that is shared amongst a plurality of RF power amplifier (PA) modules (PA1, PA2, . . . , PAk), each including a plurality of cascaded stages (e.g., $A1_1$, $A2_1$; $A1_2$, $A2_2$; . . . ; and $A1_k$, $A2_k$) and a plurality of matching networks (e.g., $MN_{01}$, $MN_{11}$, $MN_{21}$; $MN_{02}$, $MN_{12}$, $MN_{22}$; . . . ; and $MN_{0k}$, $MN_{1k}$, $MN_{2k}$). In the configuration (900) shown in FIG. 9, at any given time one of the PA modules (PA1, PA2, . . . , PAk) may be coupled to an antenna (not shown) via an antenna switch (not shown) for transmission of an amplified RF signal (RFout$_1$, RFout$_2$, . . . , RFout$_k$). It should be noted that a stage (e.g., $A1_1$, $A1_2$, $A1_k$) of each of the PA modules (PA1, PA2, . . . , PAk) to which the protection circuit (220) with current limiter is coupled/connected to, may impose different requirements (e.g., current magnitudes, size of transistor $M_{OUT}$) on the current limiting circuit based on respective operating power conditions/levels. Programmability of the reference current (e.g., Iref generated by circuit 222 of FIGS. 4A/4B) of the current limiter circuit used in the protection circuit (220), and/or of a ratio of sizes of the transistors $M_{IN}$ and $M_{OUT}$, may allow to program different current limits for each of the PA modules (PA1, PA2, . . . , PAk).

Figure 10:
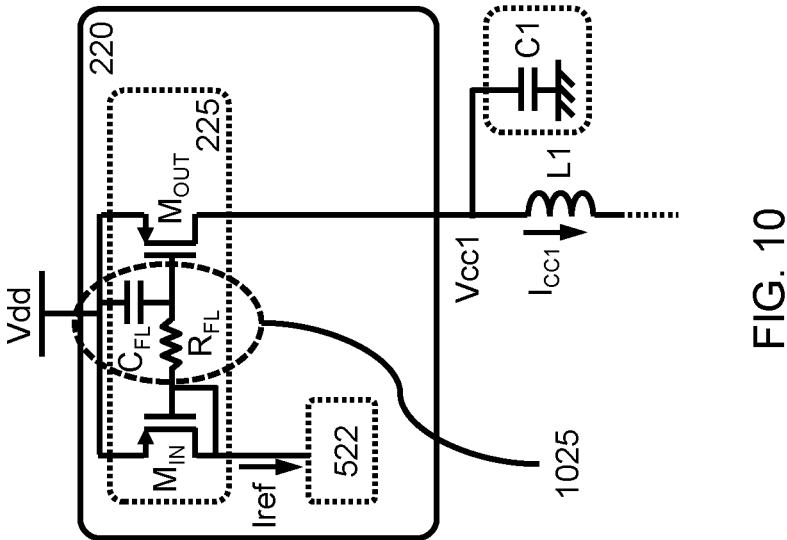
FIG. 10 shows a simplified schematic of a current limiter circuit with an embedded RF filter according to an example embodiment of the present disclosure.

FIG. 10 shows a simplified schematic of a current limiter circuit (225, 522) with an embedded RF filter circuit (1025) according to an example embodiment of the present disclosure. The current limiter circuit (225, 522) may include a reference current source/generator (522) that may be any of the above-described current source/generators (222, 422a/b/c) with reference to FIG. 3A and FIGS. 4A/4B/4C. The RF filter circuit (1025) may include a resistor, $R_{FL}$, in series connection between the gates of the transistors ($M_{IN}$, $M_{OUT}$) of the current mirror (225), and a capacitor, Cry having a first terminal connected to the resistor $R_{FL}$, at the gate of the transistor $M_{OUT}$, and a second terminal connected to the supply voltage, Vdd. The combination of the resistor, $R_{FL}$, and capacitor, Cry may form a filter that may attenuate components of an RF signal coupled to the inductor L1 that may not be sufficiently attenuated by the combination of (L1, C1), including, for example, an RF envelope signal. Because such RF envelope signal may include a frequency that is sufficiently lower than a center frequency of the RF signal targeted for attenuation by the combination of (L1, C1), it may not be sufficiently attenuated by latter combination. Attenuation/removal of RF signal related frequency components, including higher frequency components via (L1, C1) and lower frequency components via ($R_{FL}$ $C_{FL}$) may allow improved stability/performance of the current limiter circuit (225, 522).

FIG. 11 shows a configuration (1100) according to an embodiment of the present disclosure of a RF power amplifier (PA) module (e.g., comprising cascaded stages A1, . . . , Ak, . . . , Ap) with a protection circuit (220) whose operation may be controlled based on detected parameter values. As shown in FIG. 11, a detector circuit (1145) may detect values of one or more parameters and feed such values to a controller circuit (1135) that may correspondingly control operation of the protection circuit (220), including operation of the current limiter. According to an example embodiment of the present disclosure, the one or more parameters detected (e.g., sensed) by the detector may be: a temperature, such as a local temperature (e.g., at vicinity of the PA module or a stage thereof) or an ambient temperature (e.g., of room where a device containing the PA module operates); or a voltage, including, for example, a battery voltage (e.g., Vdd). Based on the detected parameter(s) value(s), the controller circuit (1135) may, for example, control/modify magnitude of the reference current (e.g., Iref of FIGS. 4A/4B), and therefore control/modify the current limit that may trigger a current limiting condition.

FIG. 12 shows a configuration (1200) according to an embodiment of the present disclosure of a RF power amplifier (PA) module with a protection circuit, the RF PA module including bipolar transistors (e.g., Tr1, Tr2). The configuration (1200) of FIG. 12 may be likened to the configuration (300a) described above with reference to FIG. 3A, with stages (A1, A2) of the PA module including respective bipolar transistors (Tr1, Tr2) instead of the cascade arrangement of stacked (MOS FET) transistors, $(M_{11}, M_{12}, \ldots M_{1k})$ and $(M_{21}, M_{22}, \ldots M_{2k})$. Accordingly, by limiting a (DC) supply current, $I_{CC1}$, to a first stage, A1, the stage itself as well as a next stage, A2 may be protected against high input RF power conditions, as described with reference to FIGS. 2A-11.

Figure 13:
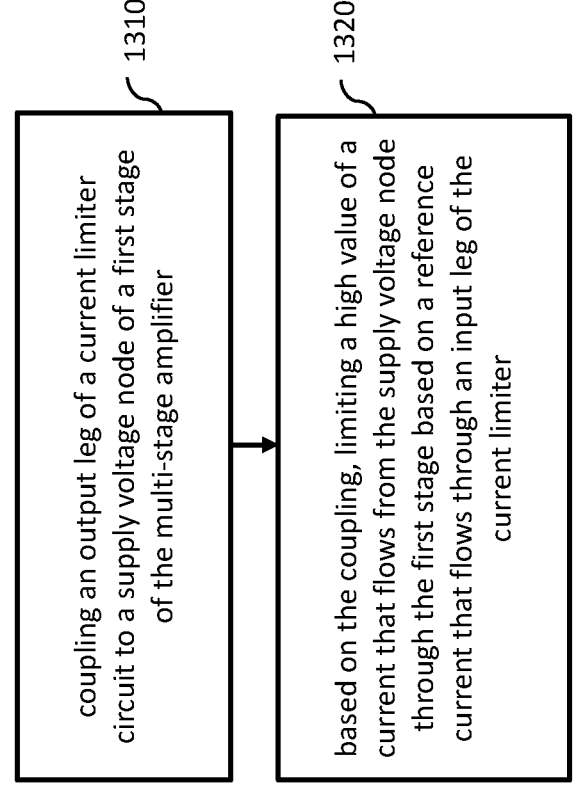
FIG. 13 is a process chart showing various steps of a method according to an embodiment of the present disclosure.

FIG. 13 is a process chart (1300) showing various steps of a method for protecting a multi-stage amplifier from high input power condition. As can be seen in the process chart (1300), the method comprises: coupling an output leg of a current limiter circuit to a supply voltage node of a first stage of the multi-stage amplifier, per step (1310), and based on the coupling, limiting a high value of a current that flows from the supply voltage node through the first stage based on a reference current that flows through an input leg of the current limiter, per step (1320).

It should be noted that the various embodiments of the PA module with protection circuit with current limiting for soft shutdown according to the present disclosure may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the described embodiments and are not intended to limit the scope of what the applicant considers to be the invention. Such embodiments may be, for example, used within mobile handsets for current communication systems (e.g., WCDMA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:
1. A circuit comprising:
a plurality of cascaded amplifier stages; and
a protection circuit coupled to a supply voltage node of a first stage of the plurality of cascaded amplifier stages, the first stage operating between the supply voltage node and a reference ground,
wherein the protection circuit comprises a current limiter circuit configured to limit a high value of a supply current that flows from the supply voltage node to the reference ground through the first stage, the high value of the supply current based on a magnitude of a reference current that is independent from an operating power of other stages of the plurality of cascaded stages;
wherein the current limiter circuit comprises:
a reference current source that generates the reference current;
a current mirror comprising an input leg and an output leg, the input leg coupled to the reference current source and the output leg coupled to the supply voltage node; and
a common-source transistor coupled to the input leg of the current mirror, wherein the reference current comprises a current that flows through the common-source transistor.

14

2. A circuit comprising:
a plurality of cascaded amplifier stages; and
a protection circuit coupled to a supply voltage node of a first stage of the plurality of cascaded amplifier stages, the first stage operating between the supply voltage node and a reference ground, the protection circuit comprising a current limiter circuit configured to limit a high value of a supply current that flows from the supply voltage node to the reference ground through the first stage, the high value of the supply current based on a magnitude of a reference current;
wherein the current limiter circuit comprises:
a reference current source configured to generate the reference current;
a current mirror comprising an input leg and an output leg, the input leg coupled to the reference current source and the output leg coupled to the supply voltage node; and
a common-source transistor coupled to the input leg of the current mirror, wherein the reference current is a current that flows through the common-source transistor based on a voltage provided to a gate of the common-source transistor.
3. The circuit of claim 2, wherein the common-source transistor is in series connection with an input transistor of the input leg of the current mirror.
4. The circuit of claim 2, wherein the reference current source comprises:
a shunted resistor coupled to the input leg of the current mirror; and
an operational amplifier having an inverting input terminal coupled to the shunted resistor to establish a voltage drop across the shunted resistor that is based on a voltage provided at a non-inverting input terminal of the operational amplifier.
5. The circuit of claim 4, wherein:
the shunted resistor is coupled to the input leg through a reference transistor whose gate is coupled to an output of the operational amplifier, and
the reference transistor is in series connection with an input transistor of the input leg.
6. The circuit of claim 4, wherein the shunted resistor comprises a tunable resistance.
7. The circuit of claim 2, wherein the reference current source comprises a temperature compensation profile.
8. The circuit of claim 2, wherein the protection circuit further comprises a clamp circuit that is configured to limit a low voltage level at the supply voltage node.
9. The circuit of claim 8, wherein:
the low voltage level is based on a difference between:
a level of a supply voltage to the current mirror, and
a sum of a gate-to-source voltage of a clamping transistor of the clamp circuit and an input transistor of the input leg of the current mirror.
10. The circuit of claim 9, wherein:
a gate of the clamping transistor is coupled to the supply voltage node,
a source of the clamping transistor is coupled to a gate of an output transistor of the output leg of the current mirror, and
a drain of the clamping transistor is coupled to the reference ground through a load.
11. The circuit of claim 2, wherein the protection circuit further comprises a pre-charge circuit configured to charge, during a standby mode of operation of the protection circuit, a bypass capacitor coupled to the supply voltage node.

12. The circuit of claim 11, wherein the pre-charge circuit comprises:

a first switch coupled between a gate of an output transistor of the output leg of the current mirror and the reference ground; and a second switch coupled between gate of an input transistor of the input leg of the current mirror and a drain of said input transistor.

13. The circuit of claim 11, wherein during at least a portion of the standby mode of operation, the first switch is closed and the second switch is open.

14. The circuit of claim 2, wherein the current mirror circuit further comprises:

a filter coupled to a gate of an output transistor of the output leg, the filter comprising a resistor and a capacitor.

15. The circuit of claim 14, wherein the filter is configured to attenuate an envelope signal of an RF signal coupled to the supply voltage node.

16. The circuit of claim 1, wherein the first stage comprises a plurality of stacked FET transistors.

17. The circuit of claim 1, wherein the first stage comprises at least one bipolar transistor.

18. The circuit of claim 1, wherein the first stage is an input stage of the plurality of cascaded amplifier stages.

19. The circuit of claim 1, wherein the first stage is a driver stage of the plurality of cascaded amplifier stages that provides an input signal to an output stage of the plurality of cascaded amplifier stages.

20. The circuit of claim 1, wherein the first stage is an output stage of the plurality of cascaded amplifier stages.

21. The circuit of claim 1, wherein the protection circuit is further coupled to a second stage of the plurality of cascaded amplifier stages.

22. A circuit comprising:

a plurality of cascaded amplifier stages; and a protection circuit coupled to a supply voltage node of a first stage of the plurality of cascaded amplifier stages, the first stage operating between the supply voltage node and a reference ground, the protection circuit comprising a current limiter circuit configured to limit a high value of a supply current that flows from the supply voltage node to the reference ground through the first stage, the high value of the supply current based on a magnitude of a reference current, the circuit further comprises additional one or more plurality of cascaded amplifier stages each comprising a respective first stage coupled to the protection circuit, at a given time, the circuit processes an RF signal through an activated plurality of cascaded amplifier stages, the activated plurality of cascaded amplifier stages comprising only one of the plurality of cascaded amplifier stages or the additional one or more plurality of cascaded amplifier stages, and the protection circuit is further configured to programmatically generate the high value of the supply current based on a specific operating power requirement of the respective first stage of the activated plurality of cascaded amplifier stages.

23. The circuit of claim 1, further comprising:

a controller circuit that is configured to control operation of the protection circuit based on a detected value of a parameter, the parameter including a temperature or a voltage.

24. The circuit of claim 1, wherein the common-source transistor is in series connection with an input transistor of the input leg of the current mirror.

25. The circuit of claim 1, wherein the reference current source comprises:

a shunted resistor coupled to the input leg of the current mirror; and an operational amplifier having an inverting input terminal coupled to the shunted resistor to establish a voltage drop across the shunted resistor that is based on a voltage provided at a non-inverting input terminal of the operational amplifier.

26. The circuit of claim 25, wherein:

the shunted resistor is coupled to the input leg through a reference transistor whose gate is coupled to an output of the operational amplifier, and the reference transistor is in series connection with an input transistor of the input leg.

27. The circuit of claim 25, wherein the shunted resistor comprises a tunable resistance.

28. The circuit of claim 1, wherein the protection circuit further comprises a clamp circuit that is configured to limit a low voltage level at the supply voltage node.

29. The circuit of claim 28, wherein:

the low voltage level is based on a difference between:

a level of a supply voltage to the current mirror, and a sum of a gate-to-source voltage of a clamping transistor of the clamp circuit and an input transistor of the input leg of the current mirror.

* * * * *